US006424031B1

(12) United States Patent
Glenn (10) Patent No.: US 6,424,031 B1
(45) Date of Patent: Jul. 23, 2002

(54) STACKABLE PACKAGE WITH HEAT SINK (75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/566,680

(22) Filed: May 8, 2000

(51) Int. Cl.[7] .............................................. H01L 23/02
(52) U.S. Cl. ..................... 257/686; 257/712; 257/777; 257/723; 257/676
(58) Field of Search ................................ 257/712, 676, 257/686, 777, 723

(56) References Cited

U.S. PATENT DOCUMENTS

| | | | |
|---|---|---|---|
| 3,838,984 A | 10/1974 | Crane et al. ..................... 37/83 |
| 4,159,221 A | 6/1979 | Schuessler ..................... 156/285 |
| 4,398,235 A | 8/1983 | Lutz et al. ..................... 361/393 |
| 4,833,568 A | 5/1989 | Berhold ..................... 361/383 |
| 4,996,587 A | 2/1991 | Hinrichsmeyer et al. ..... 357/74 |
| 5,068,713 A | 11/1991 | Toda ..................... 357/80 |
| 5,230,759 A | 7/1993 | Hiraiwa ..................... 156/69 |
| 5,239,198 A | * 8/1993 | Lin ..................... 257/693 |
| 5,258,094 A | 11/1993 | Furui et al. ..................... 156/634 |
| 5,266,834 A | 11/1993 | Nishi et al. ..................... 257/706 |
| 5,270,488 A | 12/1993 | Ono et al. ..................... 174/35 |
| 5,332,864 A | 7/1994 | Liang et al. ..................... 174/52.4 |
| 5,381,047 A | 1/1995 | Kanno ..................... 257/777 |
| 5,394,010 A | 2/1995 | Tazawa et al. ..................... 257/686 |
| 5,414,300 A | 5/1995 | Tozawa et al. ..................... 257/704 |
| 5,435,057 A | 7/1995 | Bindra et al. ..................... 29/830 |
| 5,455,387 A | 10/1995 | Hoffman et al. ............. 174/52.4 |
| 5,521,429 A | 5/1996 | Aono et al. ..................... 257/676 |
| 5,587,341 A | 12/1996 | Masayuki et al. ............. 437/206 |
| 5,594,275 A | 1/1997 | Kwon et al. ..................... 257/686 |
| 5,625,221 A | 4/1997 | Kim et al. ..................... 257/686 |
| 5,656,856 A | * 8/1997 | Kweon ..................... 257/686 |
| 5,677,569 A | 10/1997 | Choi et al. ..................... 257/686 |
| 5,715,147 A | 2/1998 | Nagano ..................... 361/813 |
| 5,742,007 A | 4/1998 | Kornowski et al. ......... 174/52.3 |
| 5,744,827 A | * 4/1998 | Jeong ..................... 257/686 |
| 5,760,471 A | 6/1998 | Fujisawa et al. ............. 257/692 |
| 5,801,439 A | * 9/1998 | Fujisawa ..................... 257/686 |

(List continued on next page.)

FOREIGN PATENT DOCUMENTS

| | | | |
|---|---|---|---|
| EP | 0 794 572 A2 | 9/1997 | ......... H01L/23/495 |
| JP | 60-236756 | 10/1985 | ........... H01L/23/02 |
| JP | 1-106456 | 4/1989 | ........... H01L/23/50 |
| JP | 2-239651 | 9/1990 | ........... H01L/25/10 |
| JP | 03-163583 | 6/1991 | ........... H01L/27/14 |
| JP | 406151656 A | * 5/1994 | |
| JP | 9-8205 | 1/1997 | |

*Primary Examiner*—Phat X. Cao
*Assistant Examiner*—Thao X. Le
(74) *Attorney, Agent, or Firm*—Skjerven Morrill LLP; James E. Parsons (57) ABSTRACT

A stackable package for an integrated circuit (e.g., a flip chip) is disclosed. The package includes a molded plastic package body having a first side, an opposite second side, and side surfaces extending vertically between the first and second sides. A plurality of leads extend from the package body. Each lead has a first portion embedded in the package body, a second portion extending vertically adjacent to a peripheral side surface of the package body, and a third portion adjacent to and extending over first side of package body. A surface of embedded first portion of the leads is exposed at the second side of the package body. The package may be vertically stacked on another package and electrically connected thereto. Keys extending from the package body of the first package engage keyholes of the other package. A heat sink is horizontally disposed between the packages. The heat sink has a rectangular body and radiating fins. The heat sink is in direct or indirect thermal contact with the integrated circuits of at least one of the packages. The indirect thermal contact may be through a die pad or thermal adhesive.

22 Claims, 6 Drawing Sheets

U.S. PATENT DOCUMENTS

| | | | | |
|---|---|---|---|---|
| 5,835,988 A | * | 11/1998 | Ishii | 257/684 |
| 5,859,471 A | | 1/1999 | Kuraishi et al. | 257/666 |
| 5,877,043 A | | 3/1999 | Alcoe et al. | 438/123 |
| 5,880,403 A | | 3/1999 | Czajkowski et al. | 174/35 R |
| 5,883,426 A | * | 3/1999 | Tokuno | 257/686 |
| 5,950,074 A | | 9/1999 | Glenn et al. | 438/121 |
| 5,962,810 A | | 10/1999 | Glenn | 174/52.2 |
| 5,977,613 A | | 11/1999 | Takata et al. | 257/666 |
| 5,986,209 A | | 11/1999 | Tandy | 174/52.4 |
| 5,994,166 A | * | 11/1999 | Akram | 438/108 |
| 6,043,430 A | * | 3/2000 | Chun | 257/672 |
| 6,091,142 A | * | 7/2000 | Lee | 257/712 |
| 6,114,221 A | | 9/2000 | Tonti et al. | 438/455 |
| 6,130,115 A | | 10/2000 | Okumura et al. | 438/124 |
| 6,143,981 A | | 11/2000 | Glenn | 174/52.4 |
| 6,197,615 B1 | | 3/2001 | Song et al. | 438/111 |
| 6,225,146 B1 | | 5/2001 | Yamaguchi et al. | 438/123 |
| 6,242,281 B1 | | 6/2001 | Mclellan et al. | 438/106 |
| 6,271,059 B1 | * | 8/2001 | Bertin et al. | 438/109 |
| 6,281,568 B1 | | 8/2001 | Glenn et al. | 257/684 |

* cited by examiner

STACKABLE PACKAGE WITH HEAT SINK

BACKGROUND OF THE INVENTION

It is known to include a plurality of integrated circuits in a single package body as a way to increase the density of integrated circuits on a printed circuit board. U.S. Pat. No. 5,815,372 provides examples of packages having two integrated circuits.

Another method to increase package density is to mount a first small outline integrated circuit package ("SOIC") having either gull wing or J lead styles on a printed circuit board. Next, the leads of a second SOIC package are cut so as to form lead stubs. The second SOIC package is then stacked on the first SOIC package, and the lead stubs are soldered to the leads of the first SOIC package. Unfortunately, this method is difficult and time consuming. Moreover, the footprint of the first SOIC package is relatively large due to the gull wing or J-style leads.

U.S. Pat. No. 5,835,988 discloses packages that can be stacked in multiple layers. It appears that the packages of FIG. 12 of the patent would be difficult to stack, because no provision is made to align the packages vertically. The embodiment of FIG. 13 of the patent employs an external leadframe between the packages, but the number of packages that can be stacked is preordained by the size of the leadframe.

SUMMARY OF THE INVENTION

The present invention provides a stackable package for an electronic device, such as an integrated circuit (e.g., a flip chip or a wire bonded integrated circuit.) The packages can be easily stacked one on top of the other. Keys and keyholes of the packages allow the packages to be stacked so that the leads of one package correctly superimpose mirror image leads of the other package, thereby allowing reliable electrical interconnections between the packages. In addition, the present invention provides a heat sink that can be inserted between the stacked packages to radiate heat.

One embodiment of a package within the present invention includes a flip chip integrated circuit encapsulated within a package body. A surface of the flip chip is exposed at a first side of the package body. Leads extend from the package body. A first portion of each lead is embedded in the package body. A surface of the embedded first portion of the lead is exposed at an opposite second side of the package body. A second portion of each lead extends vertically along the package sides, and a third portion extends over the first side of the package body. The third portion of the leads may be located within a recess formed in the first side of the package body, thereby allowing a thinner package. Keys extend from either the first or second sides of the package body, and keyholes are formed in the other of the first or second sides of the package body. The keys facilitate precise stacking of one package on another package. The keys of one package engage the keyholes of the other package stacked therewith.

In another embodiment of the present invention, a pair of such packages are stacked one on top of the other. A planar metal heat sink is disposed between the two packages. The heat sink includes a rectangular body and fins that radiate outward from each edge of the rectangular body. The fins are narrower than the space between adjacent leads of the packages. The body of the heat sink includes pairs of projections and recesses. The projections of the heat sink engage the keyholes of one of the stacked packages, and the recesses of the heat sink are filled by keys of the other package. The body of the heat sink is in contact with the exposed second surface of the flip chip of at least one of the packages, and thereby conducts heat from the flip chip. Absorbed heat is radiated by the fins.

In an alternative embodiment, the packages may include an integrated circuit mounted on a die pad. A surface of the die pad is exposed at the second side of the package body. Two such packages may be stacked with a heat sink between the packages. The heat sink contacts the exposed die pad of the upper package and thereby absorbs heat generated by the integrated circuit.

These and other features and advantages of the present invention will be further apparent in view of the drawings and exemplary embodiments described below.

BRIEF DESCRIPTION OF DRAWINGS

In the drawings, common structures amongst the various embodiments are usually referred to using the same reference numbers.

DETAILED DESCRIPTION OF THE EXEMPLARY EMBODIMENTS

Various embodiments of stackable packages are described in prior U.S. patent applications filed by the Applicant. In particular, these embodiments are described in U.S. patent application Ser. No. 09/484,192, filed on Jan. 18, 2000, and U.S. patent application Ser. No. 09/566658, entitled "Stackable Package Having a Cavity and a Lid for Electronic Device", which was filed on May 8, 2000 (the same day as the present application. The above listed applications are incorporated herein by reference in their entireties.

Figure 1:
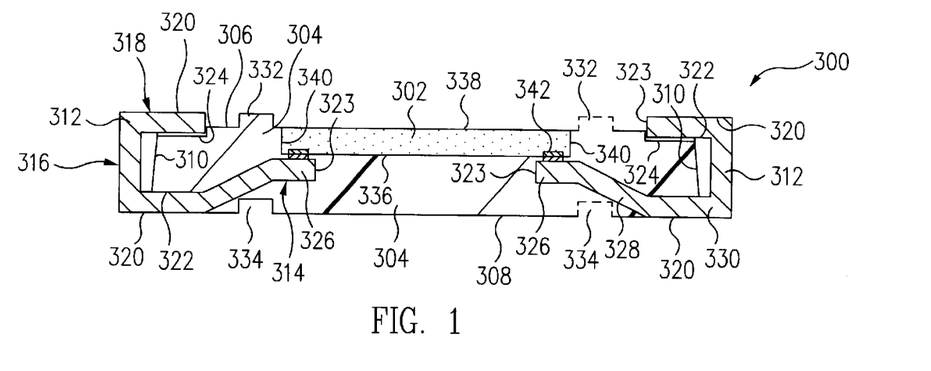
FIG. 1 is a cross-sectional side view of a stackable package.

FIG. 1 shows a stackable package 300 that contains an electronic device, which in this example is a flip chip integrated circuit 302. Flip chip 302 is embedded in package body 304, which is formed of a molded insulative encapsulant material, such as a transfer molded or injection molded plastic material. Package body 304 includes a first side 306, an opposite second side 308, and tapered vertical peripheral surfaces 310 that extend between first side 306 and second side 308.

Package 300 includes a plurality of metal leads 312. Each lead 312 includes a first portion 314 that is embedded in package body 304; a second portion 316 that is outside of package body 304 and extends vertically adjacent to a peripheral surface 310 of package body 304; and a horizontal third portion 318 that superimposes first side 306 of package body 304. Each lead 312 includes a first surface 320, an opposite second surface 322, and peripheral side surfaces 323 between first surface 320 and second surface 322. Leads 312 may be formed, for example, of copper, aluminum, Alloy 42, or some other metal. The portions of leads 312 that are outside of package body 304 may be plated with solder for external connection to another package 300 or to a printed circuit board.

Figure 7:
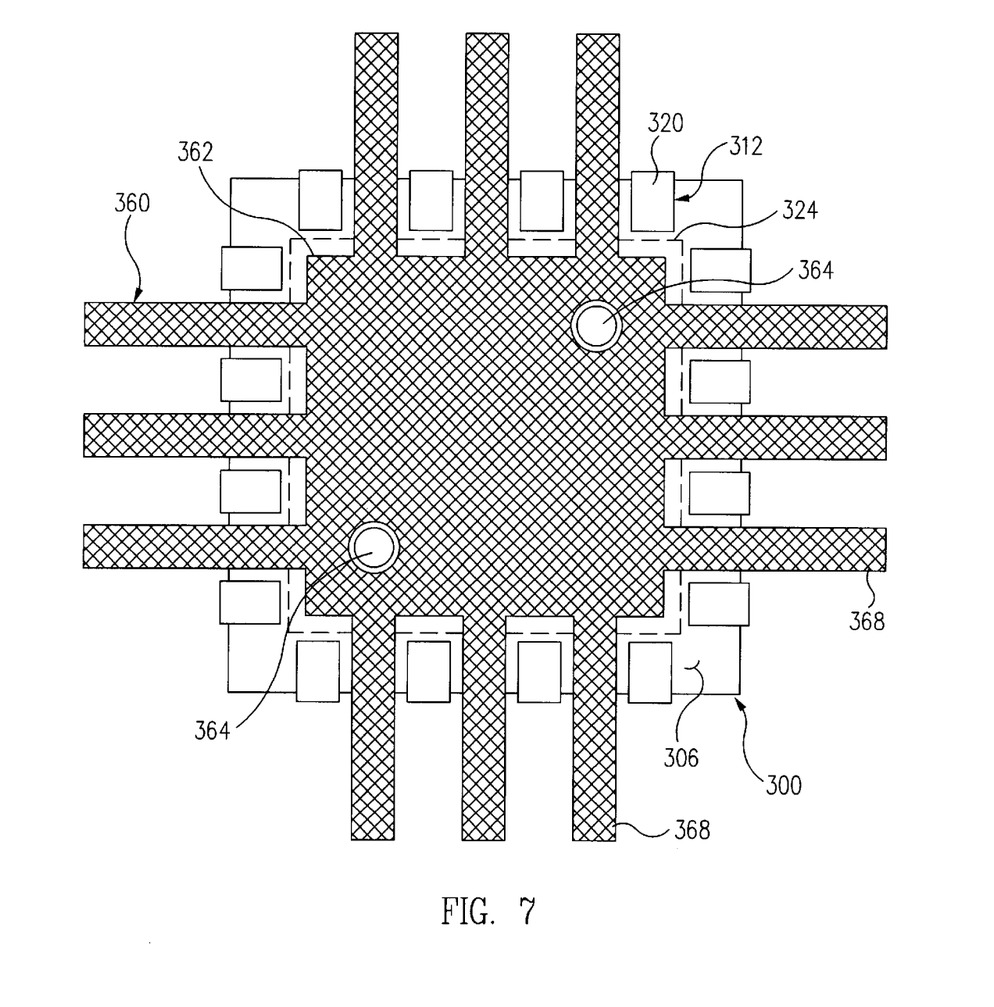
FIG. 7 is a top plan view of the heat sink of FIG. 3.

As shown in FIG. 7, leads 312 are located along each of the four sides of package body 304, forming a quad package. In an alternative embodiment, leads 312 may be located along two sides of package body 304, as in a dual package.

Recesses 324 are formed in first side 306 of package body 304 (FIGS. 1 and 7). Each recess 324 is rectangular in shape and extends along one of the four peripheral edges of upper first side 306. Third portion 318 of each lead 312 is within a recess 324. By placing third portions 318 in recesses 324, the thickness of package body 304 is minimized.

As mentioned above, first portion 314 of each lead 312 is partially embedded in package body 304. First portion 314 includes a fully encapsulated horizontal first part 326, a fully encapsulated inclined second part 328, and a partially encapsulated horizontal third part 330. In particular, second surface 322 and side surfaces 323 of third part 330 of first portion 314 of each lead 312 are covered by the encapsulant that forms package body 304. However, first surface 320 of third part 330 of first portion 314 of each lead 312 is exposed at second side 308 of package body 304. The encapsulant material surrounding first part 326 and second part 328 of first portion 314 of leads 312 keeps leads 312 from being pulled vertically from package body 304. Anchors or through holes also may be formed on first portion 314 of leads 312 to lock leads 312 to the encapsulant of package body 304. In addition, reentrant portions may be formed on peripheral sides of 323 of at least first portion 314 of leads 312 to further lock leads 312 to the encapsulant material, as is further described below with reference to FIGS. 10A–10D.

Figure 2:
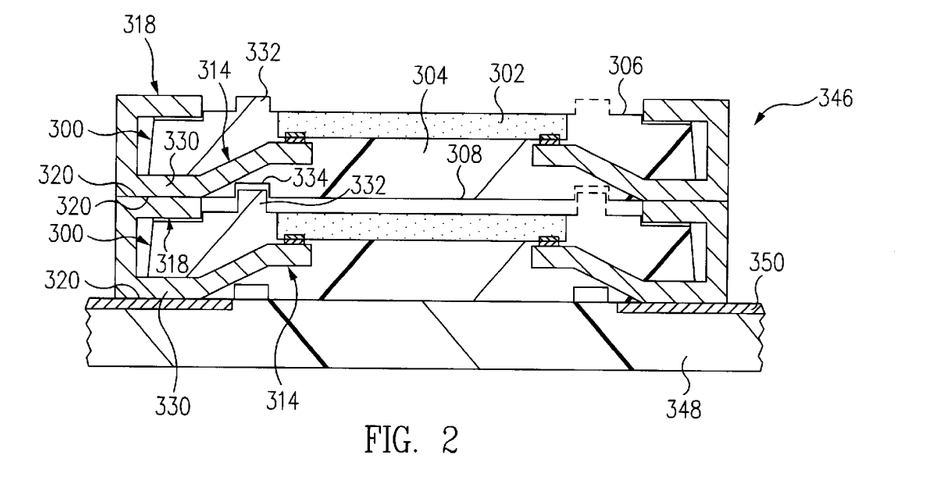
FIG. 2 is a cross-sectional side view of two packages of FIG. 1 in a stack.

A pair of diagonally opposed keys 332 protrude from first side 306 of package body 304. (Because FIG. 2 is a cross-section, only one of the two keys 332 would normally be visible; the second key 332 is shown by dash lines.) Keys 332 are formed of the encapsulant material that forms package body 304. A pair of diagonally opposed apertures, denoted as keyholes 334, are formed in second side 308 of package body 304. Keyholes 334 are located laterally between a recess 324 and flip chip 302. (Like keys 332, one of keyholes 334 is shown by dash lines.) Keys 332 and keyholes 334 have reciprocal shapes, so that keys 332 of one package 300 will fit into the keyholes 334 of another package 300 stacked with the first package 300. The engagement of keys 332 of one package into keyholes 334 of another package stacked therewith assures that the packages are properly aligned vertically. The locations of the respective keys 332 and keyholes 334 can be nonsymmetrical, so that packages 300 can be stacked only in one way. The number of keys 332 and keyholes 334 can vary, e.g., there may be one key 332 and one corresponding keyhole 334, or three keys 332 and three corresponding keyholes 334. Alternatively, a package 300 may be stacked with a different type of package (e.g., containing a different type of integrated circuit) that has similarly shaped and located keys and key holes.

Returning to FIG. 1, flip chip 302 includes a first side 336, an opposite second side 338, and peripheral surfaces 340 between first side 336 and second side 338. First side 336 and peripheral sides 340 are covered by the encapsulant material that forms package body 304. Second side 338 is exposed at first side 306 of package body 304. A row of edge bond pads 342 are located at first side 336 of flip chip 302 along each of the four peripheral edges of first side 336. Each edge bond pad 342 is electrically connected by a solder interconnection to a second surface 322 of a first part 326 of a first portion 314 of each lead 312. Accordingly, flip chip 302 may be electrically connected to an external printed circuit board through leads 312. In an alternative embodiment, instead of having a flip chip 302, a bond wired integrated circuit having center bond pads may be mounted on first part 326 of leads 312. The bond wires may extend from the center bond pads to first surface 320 of first part 326.

FIG. 2 shows a stack 346 of two electrically connected packages 300 mounted on a printed circuit board 348. In this embodiment, exposed first surface 320 of third part 330 of first portion 314 of each lead 312 of the lower package 300 is electrically connected by solder to a metal trace 350 of printed circuit board 348. The upper package 300 is vertically stacked on the lower package 300 so that first surface 320 of a third portion 318 of each lead 312 of the lower package is superimposed by and electrically connected to an exposed first surface 320 of third part 330 of a first portion 314 of a mirror image lead 312 of the upper package 300. The electrical connection may be formed by reflowed solder. Keys 332 of the lower package 300 are within keyholes 334 of the upper package 300. The engagement of keys 332 and keyholes 334 ensures that the mirror image leads 312 of the two packages 300 will be properly juxtaposed for electrical connection and will not shift off each other prior to soldering.

To provide an even more secure electrical connection between the juxtaposed portions of the leads of the stacked packages, third portion 318 of leads 312 may be formed at an oblique angle to first side 306 of package body 304. With such a bend, third portion 318 of a lower package 300 provides an upwardly directed force on the juxtaposed leads of the upper package 300.

In an alternative embodiment, more than two packages 300 may stacked one on top of the other (e.g., three, four or five packages 300 may be stacked).

Figure 3:
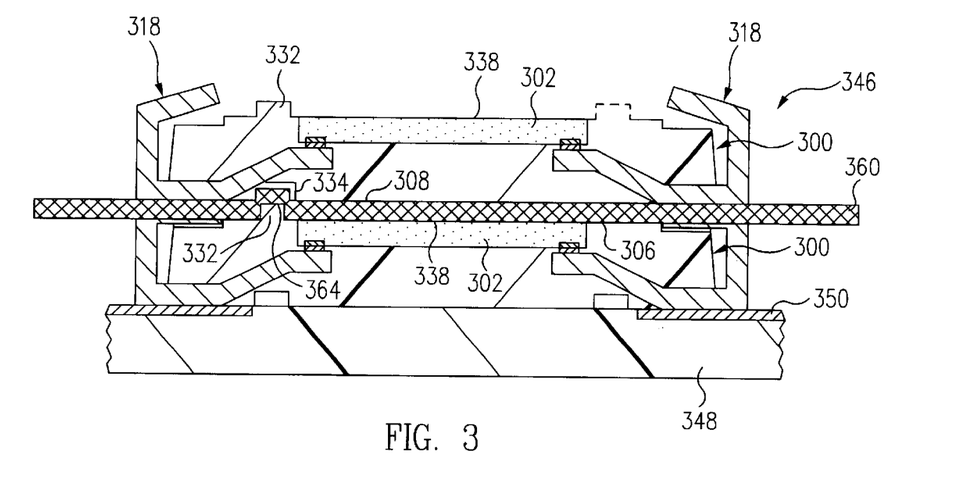
FIG. 3 is a cross-sectional side view of the stack of FIG. 2 with a heat sink disposed between the packages.

FIG. 3 shows stack 346 with a metal heat sink 360 disposed between the two packages 300. Heat sink 360 may be stamped from a sheet of copper, aluminum, steel, or some other metal. Heat sink 360 is approximately the same thickness as or thinner than leads 312. Heat sink 360 contacts the exposed second side 338 of flip chip 302 of the lower package 300, and thereby conducts heat from flip chip 302. Accordingly, heat sink 360 helps to cool flip chip 302. A thin layer of thermally conductive adhesive or solder may be used to thermally attach heat sink 360 to second side 338 of flip chip 302 of the lower package 300. To accomodate heat sink 360, while providing a reliable electrical connection between the juxtaposed portions of leads of the stacked packages, third portion 318 of leads 312 may be bent at an oblique angle to first side 306, rather than being horizontal (as in FIG. 1).

Figure 5A:
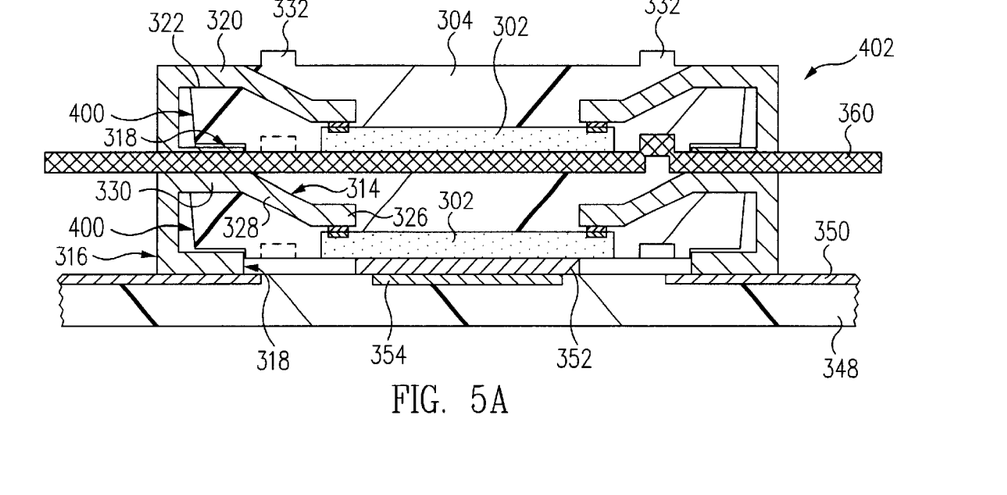
FIGS. 5A–5B are cross-sectional side views of two packages of FIG. 3 in alternative stacks with a heat sink between the packages.
Figure 6:
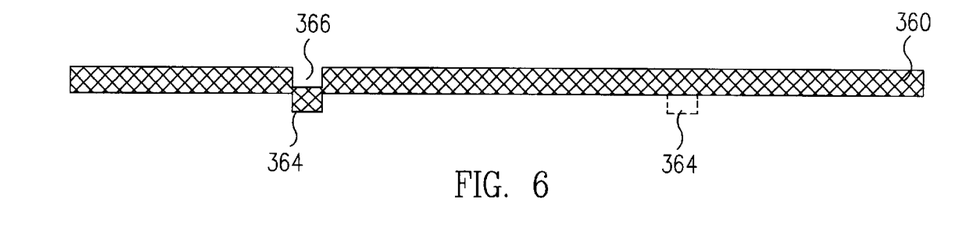
FIG. 6 is a cross-sectional side view of the heat sink of FIG. 3.

FIG. 6 shows a cross-sectional side view of heat sink 360. FIG. 7 is a top plan view of heat sink 360 taken between packages 300 of stack 346. As shown in FIG. 7, heat sink 360 includes a rectangular plate 362 that superimposes second side 338 of flip chip 302 and part of first side 306 of body 304 around second side 338. A pair of diagonally opposed stamped projections 364 extend from the planar surface of rectangular plate 362 of heat sink 360. Opposite each projection is a recess 366. The shape of projections 364 and recesses 366 matches the shape of keys 332 and keyholes 334, respectively. Accordingly, in stack 346 of FIG. 5, the keys 332 of the lower package 300 each fit within a recess 366 of heat sink 360, and projections 364 each fit within a keyhole 334 of the upper package 300. Alternatively, instead of having projections 364, heat sink 360 may have through holes arranged to that keys 332 of one package extend there-through to engage keyholes 334 of the other package.

FIG. 7 shows that a plurality of rectangular fins 368 extend from each of the four peripheral edges of rectangular plate 362 of heat sink 360. Each fin 368 extends laterally outward beyond the periphery of package body 304 of package 300. Each fin 362 is narrower than the space between adjacent leads 312, and is located so as to extend outwardly between two adjacent leads 312. The engagement of keys 332 and recesses 366, and the engagement of projections 364 and keyholes 334, keep heat sink 360 in place and thereby prevent fins 368 from contacting leads 312. In an alternative embodiment, an additional heat sink 360 may be mounted on the upper package 300 of stack 346 so as to sink heat from the respective flip chip 302.

Stack 346 may be formed by mounting a first package 300 on a printed circuit board 348. Solder connections may be formed between the juxtaposed first surface 320 of the leads 312 of the lower package 300 and the traces 350 of the printed circuit board 348. Heat sink 360 may then be placed onto the first side 306 of package 300 so that keys 332 are inserted within recesses 366. Next, a second package 300 may be mounted on heat sink 360 so that projections 364 engage the keyholes 334 of the upper package. Next, soldered electrical connections between the packages 300 may be formed by soldering the leads 312 of the upper package 300 to the juxtaposed portions of the mirror image leads 312 of the lower package 300. Alternatively, the two packages 300 may be electrically interconnected with a heat sink 360 between them, and then the assembly may be mounted on printed circuit board 348.

In an alternative embodiment, where additional packages 300 are stacked on the two packages 300 of FIG. 3, a plurality of heat sinks 360 may be used, one between each adjacent package 300.

Figure 4:
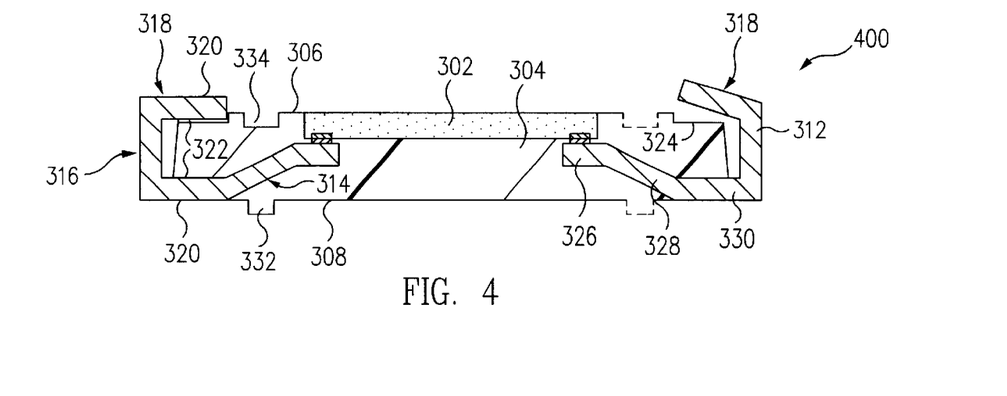
FIG. 4 is a cross-sectional side view of an alternative stackable package.

FIG. 4 shows an alternative embodiment of a package within the present invention. Package 400 of FIG. 4 is the same as package 300 of FIG. 1, except that the locations of keys 332 and keyholes 334 are reversed. That is, keys 332 extend from second side 308 of package body 304, and keyholes 334 are formed in first side 306 of package body 304. Third portion 318 of each lead 312 may be horizontal (as shown on the left side of package 400), or at an oblique angle relative to first side 306 to accomodate heat sink 360 (as shown on the right side of package 400).

FIG. 5A shows a stack 402 of two packages 400. A heat sink 360 is horizontally disposed between the packages 400. Keys 332 of the lower package 400 are engaged with recesses 366 of heat sink 360, and projections 364 are engaged with keyholes 334 of the upper package 400. The exposed first surface 320 of third part 330 of first portion 314 of each lead 312 of the lower package 300 is electrically connected by solder a first portion 320 of third portion 318 of a mirror image lead 312 of the upper package 300. The first surface 320 of third portion 318 of each lead 312 of the lower package 400 is electrically connected by solder to a metal trace 350 of printed circuit board 348. Flip chip 302 is thermally connected by a thermal adhesive or solder 352 to a heat sink 354 (or ground voltage supply) of printed circuit board 348.

Figure 5B:
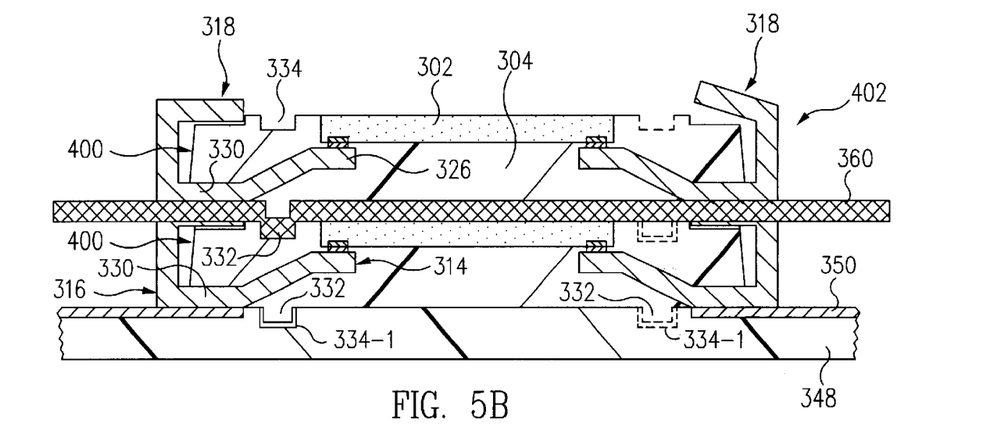

In a further alternative embodiment, shown in FIG. 5B, stack 402 of FIG. 5A is inverted. In this embodiment, printed circuit board 348 has two keyholes 334-1 within which keys 332 of the lower package 400 are inserted. The engagement of keys 332 and keyholes 334-1 allows the lower package 300 of stack 380 to be precisely located on printed circuit board 348. The exposed first surface 320 of third part 330 of first portion 314 of each lead 312 of the lower package 400 is electrically connected by solder to a metal trace 350 on printed circuit board 348. The upper package 400 is stacked on the lower package 300 so that keys 332 of the upper package 400 are engaged with recesses 366 of heat sink 360, and projections 364 of heat sink 360 are engaged with keyholes 334 of the lower package 400. In addition, the exposed first surface 320 of third part 330 of first portion 314 of each lead 312 of the upper package 300 is electrically connected by solder to a first surface 320 of a third portion 318 of a lead 312 of the lower package 400.

Figure 8:
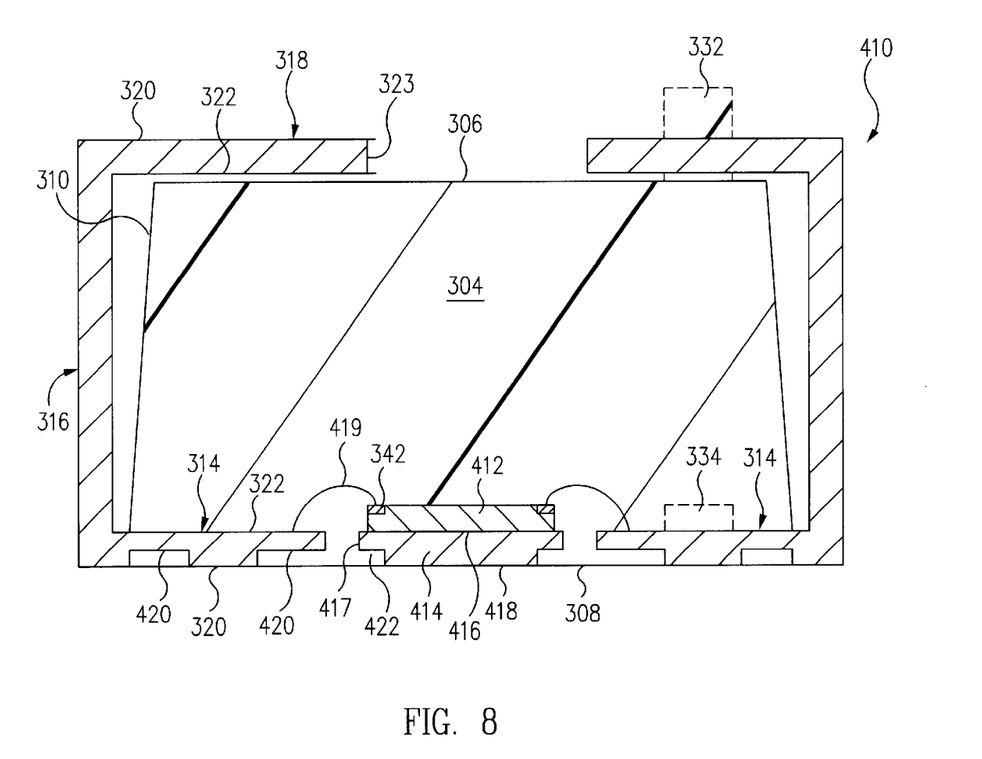
FIG. 8 is a cross-sectional side view of an alternative stackable package with an exposed die pad.

FIG. 8 shows a stackable package 410. Package 410 includes an integrated circuit 412 mounted on a first side 416 of a rectangular metal die pad 414 using a thermally conductive adhesive. Die pad 414 has an opposite second side 418 and peripheral surfaces 417. In package 410, embedded first portion 314 of each lead 312 is horizontal, and first surface 320 of first portion 314 is exposed at second surface 308 of package body 304. Die pad 414 is in the same horizontal plane as first portion 314 of leads 312, and second side 418 of die pad 414 is exposed at second side 308 of package body 304. Bond wires 419 electrically connect respective bond pads 342 of integrated circuit 412 to second surface 322 of first portion 314 of respective leads 312, thereby electrically connecting integrated circuit 412 to leads 312. Keys 332 extend from first side 306 of package body 304, and keyholes 334 are formed in second side 308 of package body 304 between die pad 414 and leads 312. If necessary, leads 312 may be removed to make room for keys 332 and keyholes 334.

The exposed first surface 320 of first portion 314 of each lead 312 of package 410 includes undercut regions 420. Second side 418 of die pad 414 includes a peripheral undercut region 422 around die pad 414. Undercut regions 420 and 422 are formed by etching about halfway through those portions of leads 312 and die pad 414 of the leadframe used to make package 410. Encapsulant of package body 304 fills in under undercut regions 420 and 422 and thereby locks leads 312 and die pad 414 to package body 304.

Figure 9:
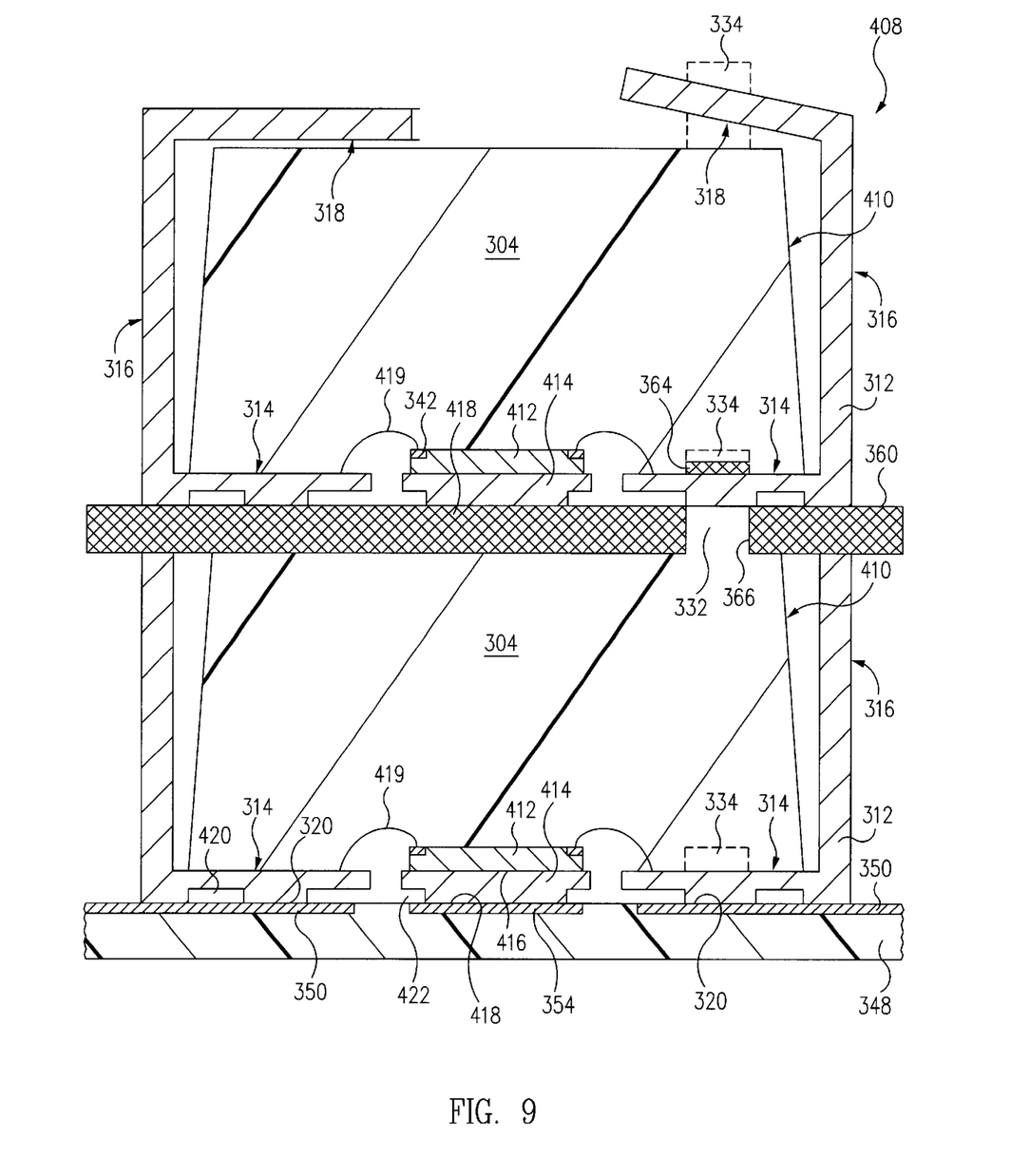
FIG. 9 is a cross-sectional side view of a stack of two of the packages of FIG. 8 with a heat sink between the packages.

FIG. 9 shows a stack 408 of two packages 410 with a heat sink 360 between them. Exposed second side 418 of die pad 414 of the lower package 410 is thermally connected to a heat sink 354 of printed circuit board 350. The exposed first surface 320 of first portion 314 of leads 312 of the lower package 410 are electrically connected to traces 350. A second package 410 is stacked on the lower package 410, and the juxtaposed portions of their respective mirror image leads 312 are electrically connected by solder. Heat sink 360 contacts the exposed second side 418 of die pad 414 of the upper package 410, and thereby conducts heat away from die pad 414 and integrated circuit 412. Projections 364 of heat sink 360 are engaged with keyholes 334 of the upper package, and keys 332 of the lower package are engaged with recesses 366 of the upper package 410. Third portion 318 of leads 312 may be at an oblique angle to accommodate heat sink 360, as shown on the right side of upper package 410 of stack 408.

In an alternative embodiment, instead of having undercut portions on die pad 414 and leads 312, reentrant portions may be formed on the peripheral sides 417 of die pad 414 and the peripheral sides 323 of at least first portion 314 of leads 312 of package 410 of FIG. 8. Encapsulant covers peripheral surfaces 417 and 323 and fills in the reentrant portions, thereby locking die pad 414 and leads 312 to package body 304.

Figure 10A:
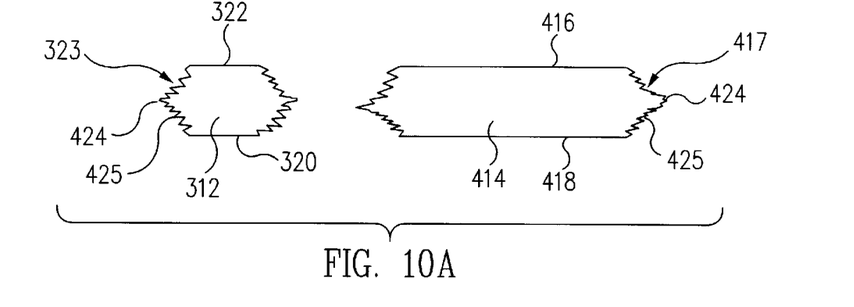
FIGS. 10A–10D are cross-sectional side views of exemplary reentrant profiles for the peripheral surfaces of the die pad and leads of the package of FIG. 8.
Figure 10B:
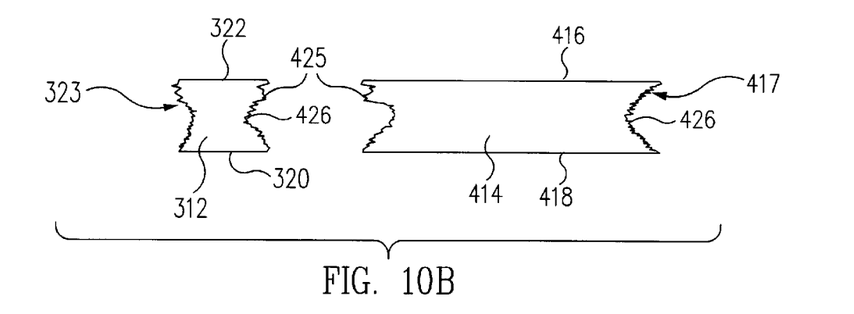
Figure 10C:
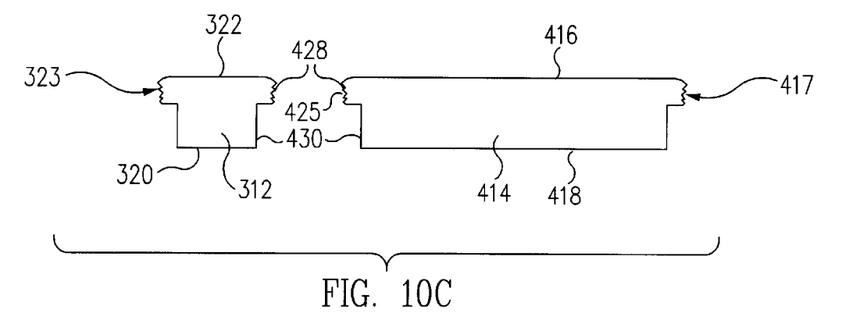
Figure 10D:
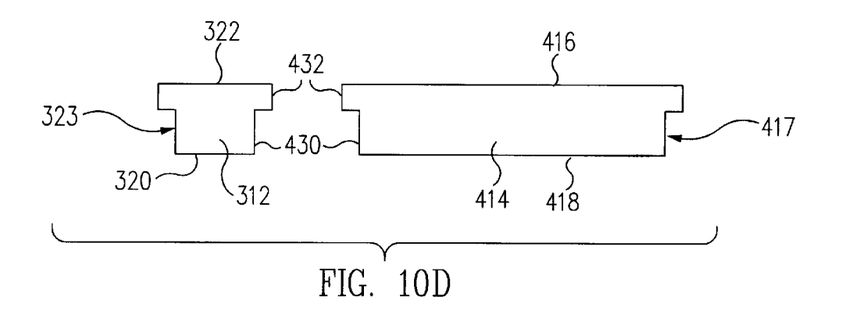

FIGS. 10A to 10D provide exemplary reentrant profiles for peripheral surface 417 of die pad 414 and peripheral surfaces 323 of at least first portion 314 of leads 312. In FIG. 10A, side surfaces 417 and 323 include two reentrant portions on opposite sides of a protruding apex 424, and numerous small asperities 425 that are much smaller in depth than the reentrant portions. This profile may be formed during the formation of the leadframe by chemically etching an unpatterned metal sheet from both sides and underetching, that is, etching for less time than would be required to form orthogonal surfaces. In FIG. 10B, side surfaces 417 and 323 include a central depression 426 and numerous small asperities 425. This profile may be formed during the formation of a leadframe by chemically etching an unpatterned metal sheet from one side and overetching, that is, etching for more time than would be required to form orthogonal surfaces. The encapsulant fills depression 426 and the asperities 425. In FIG. 10C, side surfaces 417 and 323 include a cornice-like top portion 428 that extends outward beyond a reentrant lower orthogonal portion 430. Asperities 425 cover top portion 428. Encapsulant fills in under top portion 428, fills the asperities 425, and contacts the recessed orthogonal portion 430. This profile may be formed by forming the leadframe using chemical etching or progressive stamping, and then coining a surface of the leadframe to form top portion 428. Finally, in FIG. 10D, side surfaces 417 and 323 have an inverted L-shape that maybe formed by progressively stamping the leadframe from a metal sheet, and then partially stamping through the lead frame in the appropriate peripheral areas of die pad 414 and leads 312 to form protruding top portion 432. Encapsulant fills in under top portion 432 and contacts recessed orthogonal portion 430.

Artisans will appreciate that the packages described herein and in the incorporated applications can be stacked or horizontally arranged in a variety of ways. Indeed, three dimensional arrangements of electrically interconnected packages can be formed using the package embodiments of the present invention. The heat sink of the present invention allows heat to be transferred from a package of a vertical stack.

The examples given above are exemplary only. The present invention is defined by the following claims.

What is claimed is:

1. A stackable package for an integrated circuit, the package comprising:
    a package body having a first side, an opposite second side, and side surfaces extending vertically between the first and second sides, said package body formed of a molded insulative encapsulant material, wherein at least one of the first side and second side of the package body includes at least one integrally molded member extending therefrom, and at least the other of the first or second sides of the package body includes at least one hole shaped to receive a similarly shaped member of another said stackable package;
    a plurality of leads each having a first portion embedded in the package body, a second portion extending vertically adjacent to a peripheral side surface of the package body, and a third portion adjacent to and extending over first side of package body, wherein a surface of embedded first portion of the leads is exposed at the second side of the package body; and
    an integrated circuit having a first surface with bond pads thereon and an opposite second surface, wherein the first surface of the integrated circuit is covered with encapsulant, the integrated circuit is mounted on the embedded first portion of the leads and the bond pads are electrically connected thereto, and the second surface of the integrated circuit is exposed at the first side of the package body.

2. The package of claim 1, further comprising a heat sink mounted on the first side of the package body in thermal contact with the exposed second surface of the integrated circuit.

3. The package of claim 1, wherein the integrated circuit is a flip chip.

4. The package of claim 1, further comprising a heat sink mounted on the first side of the package body in thermal contact with the exposed second surface of the integrated circuit, said head sink including at least one aperture, each said aperture in a corresponding location with the at least one member or hole of the first side.

5. The package of claim 4, wherein the heat sink includes a central plate and fins that extend horizontally beyond peripheral edges of the packages of the stack, said fins each extending outward between the third portions of adjacent leads.

6. The package of claim 1, wherein the first side of the package body includes a recess each adapted to receive the third portion of at least one said lead.

7. The package of claim 6, wherein the third portion of the leads is bent at an oblique angle to the first side of the package body.

8. The package of claim 1, wherein the third portion of the leads is bent at an oblique angle to the first side of the package body.

9. The package of claim 1, further comprising a heat sink mounted on the first side of the package body in thermal contact with the exposed second surface of the integrated circuit, said heat sink including at least one protrusion adapted to fit in the at least one hole, and a recess adapted to receive the at least one member.

10. A mounting comprising:
    at least first and second integrated circuit packages electrically connected with each other and in a vertical stack, wherein each of the first and second packages includes
        a molded insulative package body having a first side, an opposite second side, and side surfaces extending vertically between the first and second sides, wherein at least one of the first side and second side of the package body includes at least one integrally molded member extending therefrom, and at least the other of the first or second sides of the package body includes at least one hole shaped to receive a similarly shaped member of another said stackable package,
        a plurality of leads each having a first portion embedded in the package body, a second portion extending vertically adjacent to a peripheral side surface of the package body, and a third portion adjacent to and extending over first side of package body, wherein a surface of embedded first portion of the leads is exposed at the second side of the package body, and an integrated circuit device within the package body; and a heat sink disposed between the packages, wherein the at least one member of at least one of the first and second packages is coupled with the heat sink.

11. The mounting of claim 10, wherein the heat sink includes a central plate and fins that extend horizontally beyond peripheral edges of the packages of the stack.

12. The mounting of claim 10, wherein a surface of the integrated circuit of at least one of the packages is exposed at the first side of the package body, and the heat sink is in thermal contact with said exposed surface of the integrated circuit.

13. The mounting of claim 10, wherein at least one of the packages includes a die pad having a surface exposed at the first side of the package, and the heat sink is in thermal contact with said exposed surface of the die pad.

14. The package of claim 11, wherein fins each extend outward between the third portions of adjacent pairs of the leads.

15. The mounting of claim 10, wherein the heat sink includes a central plate and fins that extend horizontally beyond peripheral edges of the packages of the stack, said fins each extending outward between the third portions of adjacent pairs of the leads.

16. The mounting of claim 10, said heat sink including at least one protrusion in the at least one hole of at least one of the first and second packages, and a recess within which the at least one member of at least the other of the first or second packages is disposed.

17. The mounting of claim 10, wherein the heat sink includes at least one aperture through which the member of at least one of the first and second packages extends.

18. A stackable package for an integrated circuit, the package comprising:

a package body having a first side, an opposite second side, and side surfaces extending vertically between the first and second sides, said package body formed of a molded insulative encapsulant material, wherein at least one of the first side and second sides of the package body includes at least one integrally molded member extending therefrom, and at least the other of the first or second sides of the package body includes at least one hole shaped to receive a similarly shaped member of a second package to be stacked with the package;

a plurality of leads each having a first portion embedded in the package body, a second portion extending vertically adjacent to a peripheral side surface of the package body, and a third portion adjacent to and extending over first side of package body, wherein a surface of embedded first portion of the leads is exposed at the second side of the package body;

an integrated circuit within the package body and in an electrical connection with the embedded first portion of the leads; and a heat sink mounted on the first side of the package body and thermally coupled with the integrated circuit, said head sink including a means for allowing the at least one member or hole of the first side of the package body to be coupled with a reciprocal said hole or member of the second package.

19. The package of claim 18, wherein the means comprises at least one aperture in the heat sink, each said aperture in a corresponding location with the at least one member or hole of the first side.

20. The package of claim 18, wherein the means comprises at least one protrusion adapted to fit in the at least one hole, and a recess adapted to receive the at least one member.

21. The package of claim 18, wherein the heat sink includes a central plate and fins that extend horizontally beyond peripheral edges of the package, said fins each extending outward between adjacent pairs of the leads.

22. The package of claim 18, wherein the heat sink is thermally coupled to the integrated circuit by through a metal die pad within the package body and upon which the integrated circuit is mounted.

* * * * *

UNITED STATES PATENT AND TRADEMARK OFFICE
CERTIFICATE OF CORRECTION

PATENT NO. : 6,424,031 B1
DATED : July 23, 2002
INVENTOR(S) : Thomas P. Glenn

It is certified that error appears in the above-identified patent and that said Letters Patent is hereby corrected as shown below:

Column 9,
Line 20, delete "package" and insert -- mounting --;
Line 20, insert -- the -- before "fins";

Column 10,
Line 37, delete "by".

Signed and Sealed this

Fourth Day of March, 2003

JAMES E. ROGAN
*Director of the United States Patent and Trademark Office*